(12) United States Patent
Nasr

(10) Patent No.: US 6,825,545 B2
(45) Date of Patent: Nov. 30, 2004

(54) ON CHIP DECAP TRENCH CAPACITOR (DTC) FOR ULTRA HIGH PERFORMANCE SILICON ON INSULATOR (SOI) SYSTEMS MICROPROCESSORS

(75) Inventor: Andre I. Nasr, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,386

(22) Filed: Apr. 3, 2003

(65) Prior Publication Data

US 2004/0195621 A1 Oct. 7, 2004

(51) Int. Cl.[7] ............................................. H01L 29/94
(52) U.S. Cl. ...................................... 257/532; 257/301
(58) Field of Search .......................... 257/68, 301–305, 257/532–535

(56) References Cited

U.S. PATENT DOCUMENTS

| | | | | |
|---|---|---|---|---|
| 5,606,188 A | * | 2/1997 | Bronner et al. ............. | 257/301 |
| 5,665,622 A | * | 9/1997 | Muller et al. ................ | 438/243 |
| 5,759,907 A | * | 6/1998 | Assaderaghi et al. ........ | 438/386 |
| 6,387,772 B1 | * | 5/2002 | Chittipeddi et al. ......... | 438/386 |
| 6,538,283 B1 | * | 3/2003 | Chittipeddi et al. ......... | 257/347 |

* cited by examiner

*Primary Examiner*—Long Pham
*Assistant Examiner*—Marcos D. Pizarro-Crespo
(74) *Attorney, Agent, or Firm*—Whitham, Curtis & Christofferson, P.C.; H. Daniel Schnurmann

(57) ABSTRACT

A semiconductor method integrates a DTC on SOI for the purpose of accomplishing a robust circuit design with low noise while reducing the silicon area used. The DTC for SOI devices comprises a buried oxide layer on a silicon substrate with a silicon layer over the buried oxide layer. Shallow trench insulation extends to the buried oxide layer in the silicon layer. A first trench is formed in the shallow trench insulation and extends through the buried oxide layer into the silicon substrate. The first trench has formed on the walls thereof an oxide insulating layer and is then filled with polysilicon to form the DTC. A second trench is formed in the silicon layer adjacent to the first trench and extends through the buried oxide layer into the silicon substrate. The second trench is filled with polysilicon and forms the substrate contact for the DTC.

8 Claims, 12 Drawing Sheets

ON CHIP DECAP TRENCH CAPACITOR (DTC) FOR ULTRA HIGH PERFORMANCE SILICON ON INSULATOR (SOI) SYSTEMS MICROPROCESSORS

BACKGROUND OF INVENTION

The present invention generally relates to integrated circuit (IC) structures in complementary metal oxide semiconductor (CMOS) circuits and, more particularly, to a new method for integrating an embedded high capacitance, low leakage decoupling capacitor on silicon on insulator (SOI) or bulk wafers for very high performance CMOS microprocessors.

The goal for semiconductor designers is to design highly reliable, super high performance CMOS microprocessors with ever increasing functionality requirements, while consuming the lowest possible power. This becomes more important for low power battery operated devices where battery operating lifetime is crucial.

In this mode of operation, circuit designers face a number of challenges to insure high signal integrity within the chip and the semiconductor package. Simultaneous switching through the input and output (I/O) pins give to current "noise" spike $\delta I$ within a specified time, severely degrading the signal integrity. The signal integrity is jeopardized mainly by the "noise" on the power and ground planes due to the capacitance coupling between power and signal lines. These noises become more severe as the clock frequency or the I/Q pin count is increased.

To insure the system reliability against such deleterious effects, decoupling capacitors, known as Decap, are added to the power and ground planes to provide an AC ground for the noise and provide a stable DC voltage. The value of the Decap is usually modeled by:

Decoupling Cap (Decap)=Current spike $\delta I \times$Time/($\delta V$ Voltage Noise)

Currently, the methodology for embedding a Decap on a microprocessor is to use available structures in the semiconductor process flow; i.e., N-type field effect transistor (NFET), P-type field effect transistor (PFET), or capacitors, all of which strongly depend on the thickness of the gate oxide (Tox) used to meet the necessary capacitance predicted in the above equation. As oxide thickness is scaled down, in order to increase the capacitance value in a preset silicon active area, the gate current leakage will increase accordingly. It has been determined experimentally that the gate leakage current increases by a factor of 2.5–3 times for every 1 Angstrom (1 Å) of gate oxide scaling.

In order to increase the gate capacitance and reduce power dissipation and at the risk of increased process complexity and cost, it is possible to build a process with multiple gate oxide offering:

the "thin gate oxide" for high performance NFET and PFET devices;

the other "thick gate oxide" for the Decap capacitance with limited leakage value to reduce the power dissipation, but reduced capacitance; and another possible method is to introduce a third "intermediate" gate oxide which balances the increased gate capacitance, but at the risk of increased gate leakage.

State of the art microprocessor Decap requires as much as a micro Farad (1 $\mu$F) designed in a half centimeter square area (0.5 cm$^2$). A significant amount on a required silicon real estate area in light of the reduced number of chips which can be placed on a wafer and the reduced profit associated with this.

Table 1 describes an example of an available microprocessor surface area which can be used to obtain a Decap requirement of 1 $\mu$F, using various thin and thick oxide values. As an example, DG represents the "thick gate oxide" of 22 Å, the "thin gate oxide" of 10 Å or a combined area of "thin" and "thick" and "intermediate" gate oxide of 15 Å.
[t1]

TABLE 1

1 $\mu$F Decap Area Requirements

| Decap Area (cm$^2$) Necessary for 1 $\mu$F Decap | DG (22 Å) | DG + Thin (10 Å) | DG + Intermediate (15 Å) |
|---|---|---|---|
| Case 1 | 0.54 cm$^2$ | | |
| Case 2 | | 0.34 + 0.21 cm$^2$ | |
| Case 3 | | | 0.34 + 0.21 cm$^2$ |

FIG. 1 shows the calculated Decap value in micro Farads ($\mu$F) as a function of gate oxide thickness in nanometers for an available area of 0.54 cm$^2$ on a typical high performance microprocessor design. Note that for a robust signal integrity design, a Decap capacitance of 1 $\mu$F is required, where only 0.6 to 0.8 $\mu$F can be provided using the current planar gate oxide decap method and the limited set silicon area.

FIG. 2A shows the current standard method of forming a planar Decap on SOI, starting with a thin gate oxide on silicon wafer which forms the bottom plate of the capacitor. Although the object of the invention is not the Silicon On Insulator (SOI) formation itself, it is described here for clarity of understanding the preferred embodiment of the invention. One method of forming such an SOI substrate wafer is through the implantation of oxygen specie at high energy as to embed the oxygen deep in the silicon substrate 1 and leave a layer of silicon 3 free from oxygen on top of the oxygen level. This is followed by an annealing step at high temperature, which results in the formation of a buried silicon dioxide (BOX) layer 2, below a shallow silicon layer, (layer 3) on top of the BOX layer 2 on the silicon substrate 1.

The silicon layer 3 is divided into regions by shallow trench insulation (STI) 4 and, by process of patterning with photoresist and doping well known in the art, the respective regions are made to be n-type or p-type regions, as shown. The structure is then wet cleaned, and a thick gate oxide 5 is formed. Then a photoresist is spun on, patterned and developed to protect the thick gate oxide. The exposed area is then wet etched to remove the unprotected thick gate oxide. Next, the photoresist is stripped and a thin gate oxide 6 is grown.

FIG. 2B shows a standard method for gate interconnect polysilicon deposition to form the top plate of the capacitor. More specifically, a low pressure chemical vapor deposition (LPCVD) of polysilicon 7 covers the entire structure to a thickness of 150 nm. Then, by plasma enhanced chemical vapor deposition (PECVD), a 50 nm layer of gate capacitor oxide 8 is deposited. An anti-reflective coating (ARC) 9 to a thickness of 90 nm is deposited, followed by a photoresist layer 10 to a thickness of 240 nm. The photoresist layer 10 is patterned, exposed and developed to form the mask in the form of 70 nm wide resist lines.

FIG. 2C shows a planar Decap polysilicon lithographic pattern. Although only single fingers of polysilicon are shown for the sake of clarity, in practice the Decap must be designed with multiple fingers of polysilicon lines for defect reasons. After etching back to the thick and thin gate oxides 5 and 6, the photoresist 10 and the anti-reflective coating 9 are stripped, leaving the polysilicon lines 11.

The left sides of FIGS. 3A and 3B show, respectively, a top view and a side view in schematic representation of the planar Decap structure formed by the process described with respect of FIGS. 2A, 2B and 2C. It will be immediately apparent from FIG. 3A the relatively large active area required by the planar Decap structure.

SUMMARY OF INVENTION

It is therefore an object of the present invention to provide a new structure and process to form a new Decap Trench Capacitor (DTC) which provides increased capacitance within in a smaller active silicon area than prior planar Decap capacitors.

It is another object of the invention to provide a new semiconductor method of integrating Decap trench capacitors on SOI for the purpose of accomplishing a robust circuit design with low noise while reducing the active silicon area used.

According to one aspect of the invention, there is provided a new semiconductor Decap Trench Capacitor (DTC) integrated on a SOI for the purpose of accomplishing a robust circuit design with low noise while reducing the silicon area used. The DTC for SOI devices comprises a buried oxide layer on a silicon substrate with a silicon layer over the buried oxide layer. Shallow trench insulation extends to the buried oxide layer in the silicon layer. A first trench is formed in the shallow trench insulation and extends through the buried oxide layer into the silicon substrate. The first trench has formed on the walls thereof an oxide insulating layer, serving as the dielectric for the capacitor, and this trench is then filled with polysilicon to form the DTC. A second trench is formed in the silicon layer adjacent to the first trench and extends through the buried oxide layer into the silicon substrate. The second trench is filled with polysilicon and forms the substrate contact for the DTC.

The DTC is manufactured beginning with a first lithography step to form a mask on top of a SOI substrate followed by an etch step to form trenches of various depth through the buried oxide BOX layer to define a capacitor region and a substrate contact region. An implant step inside the substrate contact region can be performed to lower the contact resistance to the substrate. This is followed by a thin oxidation step or deposition step on the surface of the wafer and inside the trench to form the basis for the dielectric for the desired capacitor. A second lithography step is performed to define over the capacitor region and expose the substrate contact region. A wet etch step is used to etch the grown or deposited oxide inside the substrate contact region without etching the oxide inside the capacitor region. A top layer of conductive material (i.e., polysilicon) is deposited to fill the capacitor region and the substrate contact region followed by a chemical mechanical polishing. The polysilicon surface forms the top plate for the capacitor, while simultaneously forming the contact to the substrate bottom plate capacitor.

BRIEF DESCRIPTION OF DRAWINGS

The foregoing and other objects, aspects and advantages will be better understood from the following detailed description of a preferred embodiment of the invention with reference to the drawings, in which:

FIGS. 3A-1, 3A-2 and 3B-1, 3B-2 are, respectively, top views and cross-sectional views showing a comparison of planar and trench capacitor Decaps;

DETAILED DESCRIPTION

Figures 2, 3A:
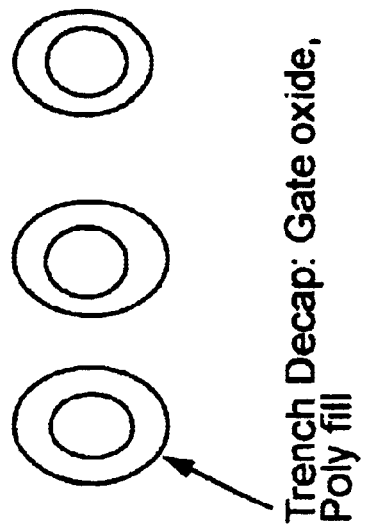
Figures 1, 3A:
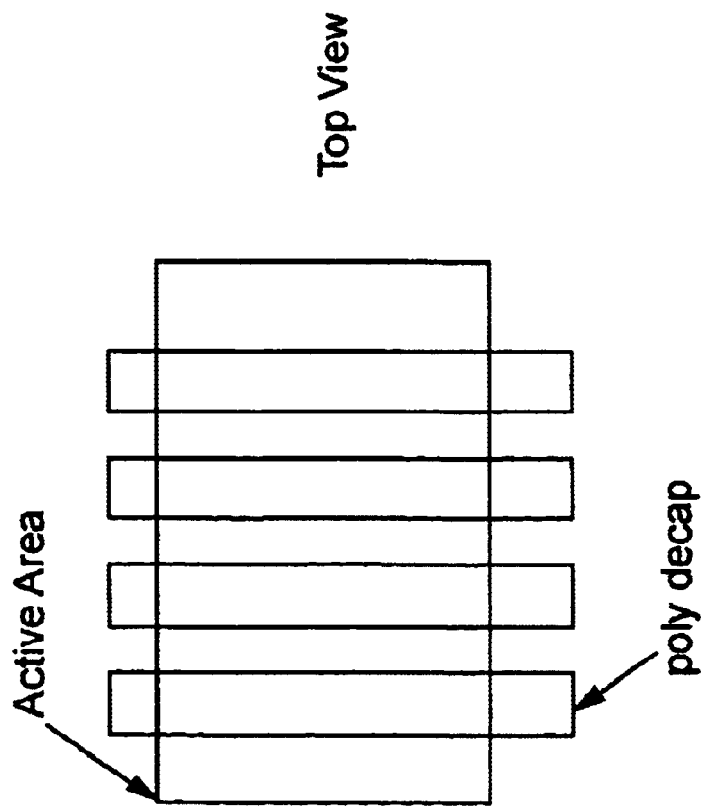
Figures 2, 3B:
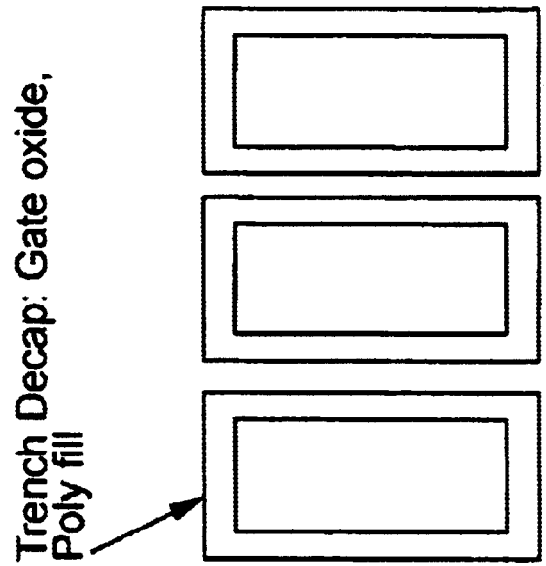
Figures 1, 3B:
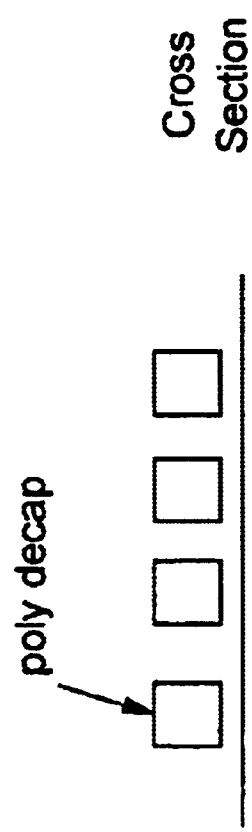

Referring again to FIGS. 3A-1, 3A-2 and 3B-1, 3B-2, there is shown a comparison of a top and cross sectional views of a Decap formed with the standard method of forming a planar Decap on the left and the new improved method on the right using a trench Decap on silicon on insulator (SOI) type wafer. As is clearly evident on the right side of FIG. 3A, the trench Decap structure occupies a considerably smaller active area of the silicon real estate than the conventional planar Decap structure.

Figure 4:
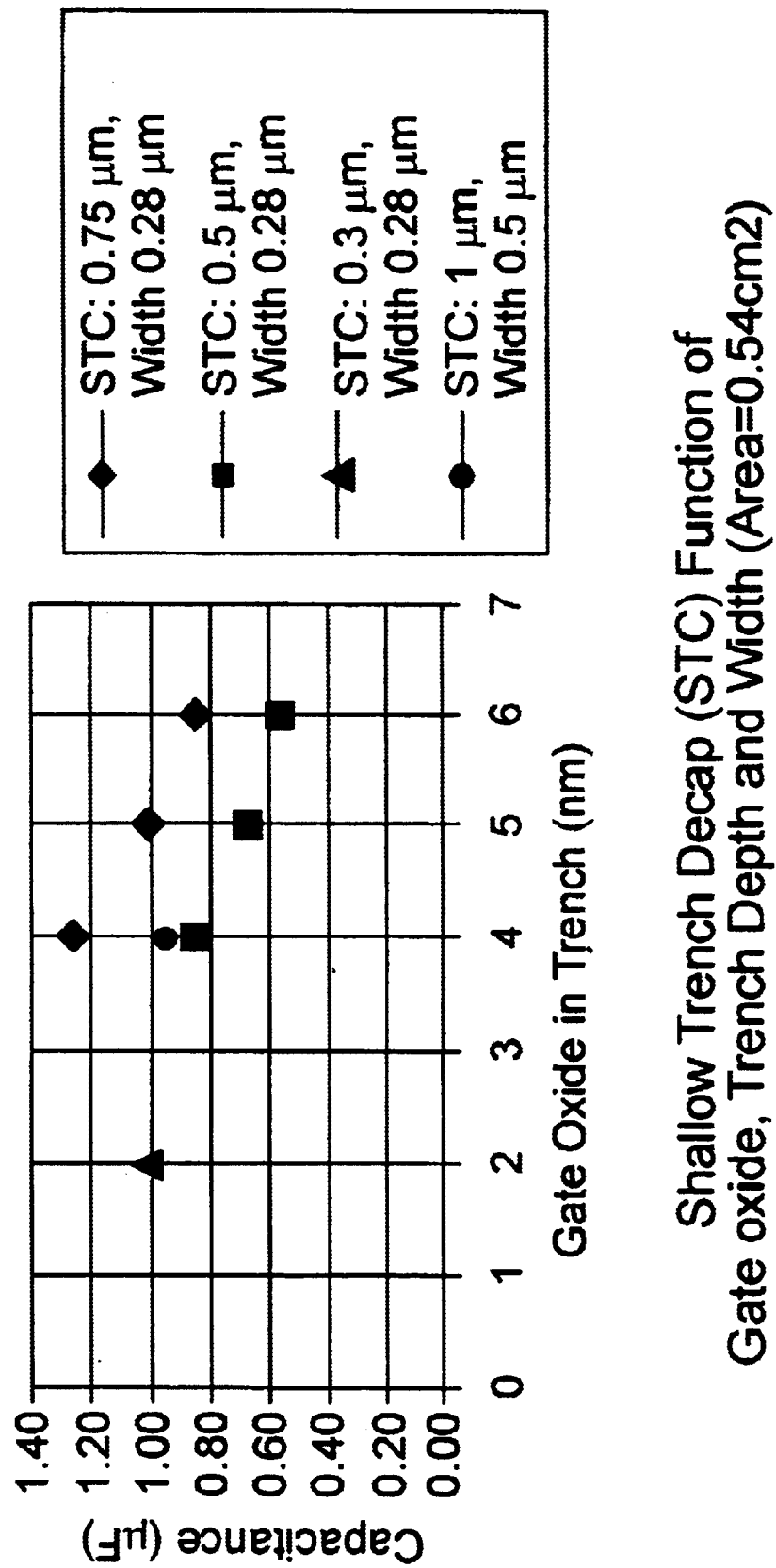
FIG. 4 is a graph showing shallow trench Decap capacitor (STC) as a function of gate oxide, trench depth and width.

FIG. 4 shows a range of Decap values which can be offered using the new improved embedded DTC. For example, a 4 nm gate oxide and trench capacitor depth of 0.7 $\mu$m and a width of 0.28 $\mu$m, a Decap value of 1.3 $\mu$F can be easily manufactured without increasing power dissipation due to gate leakage. A deeper trench can be easily processed with a Decap above 1.5 $\mu$F.

Figure 5:
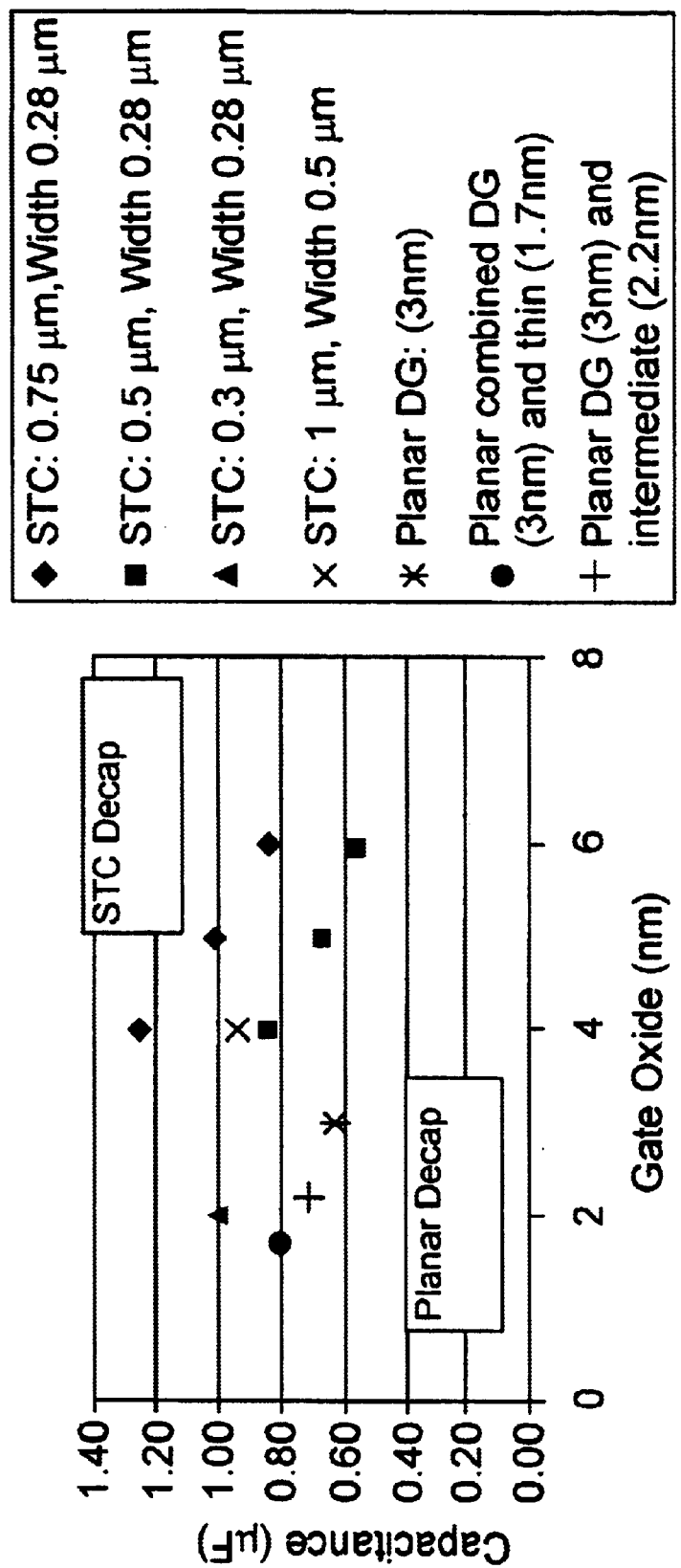
FIG. 5 is a graph showing a comparison between STC and planar capacitor.

FIG. 5 depicts side-by-side comparison the improvement provided with the new method for forming a DTC Decap versus the planar method of forming a Decap drawn as a function of gate oxide thickness. The new method clearly shows a superior capacitance value for reduced dependency on gate oxide thickness.

Figure 1:
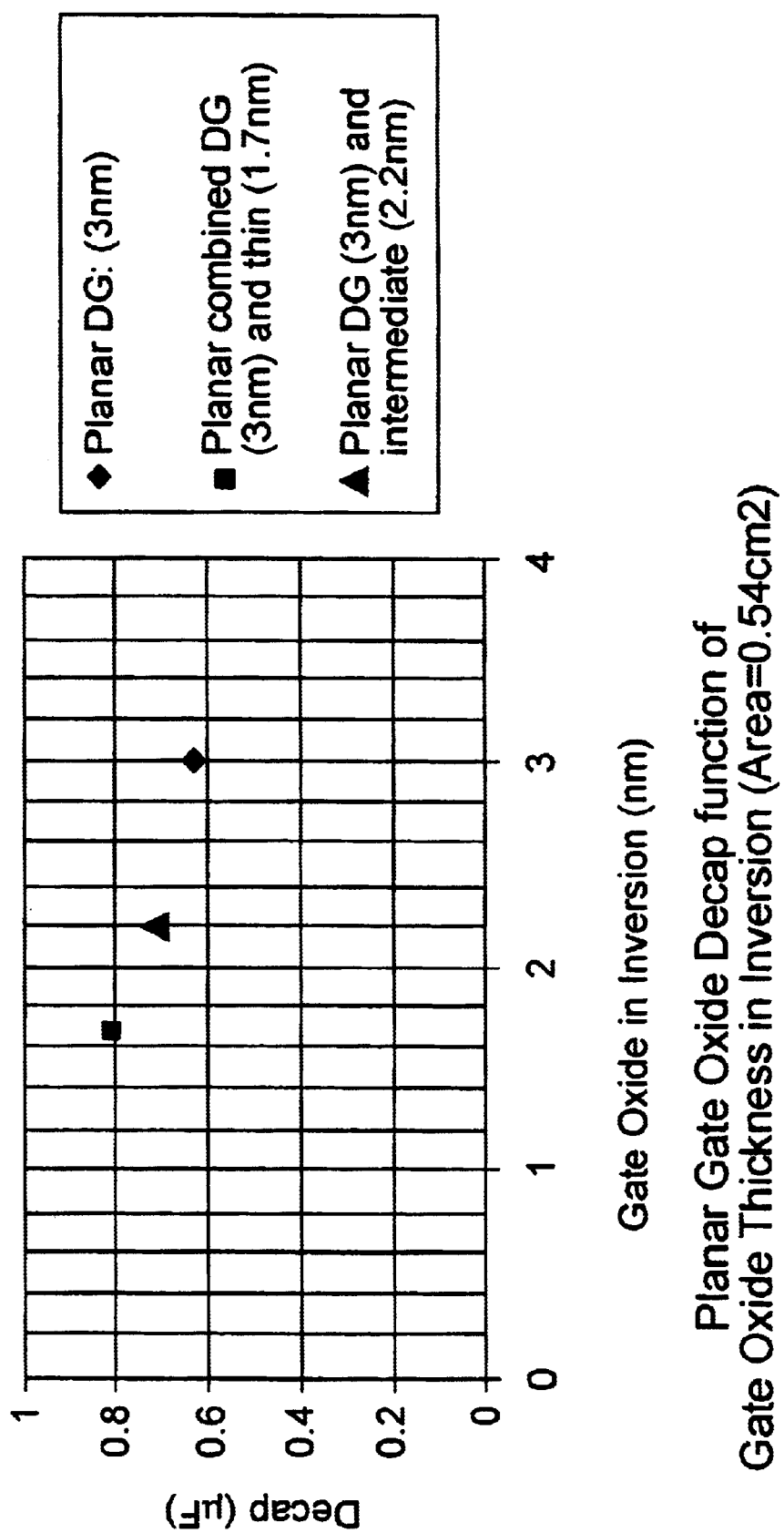
FIG. 1 is a graph showing planar gate oxide Decap as a function of gate oxide thickness in inversion.
Figure 2A:
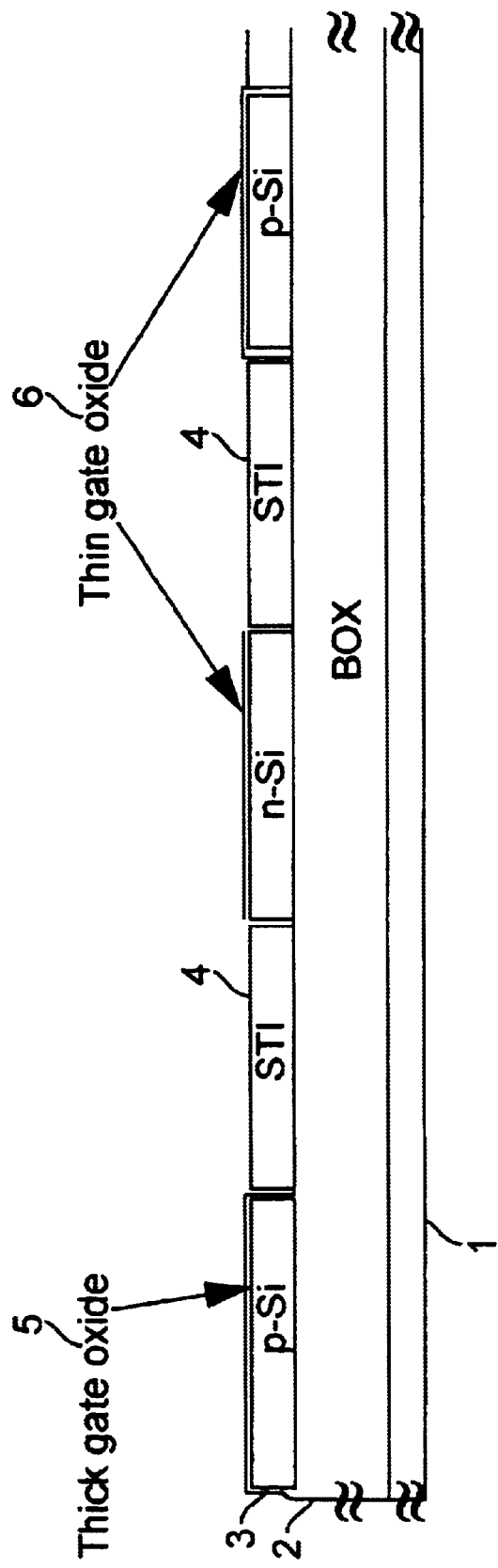
FIGS. 2A to 2C area cross-sectional views showing the semiconductor method for forming a standard planar Decap.
Figure 2B:
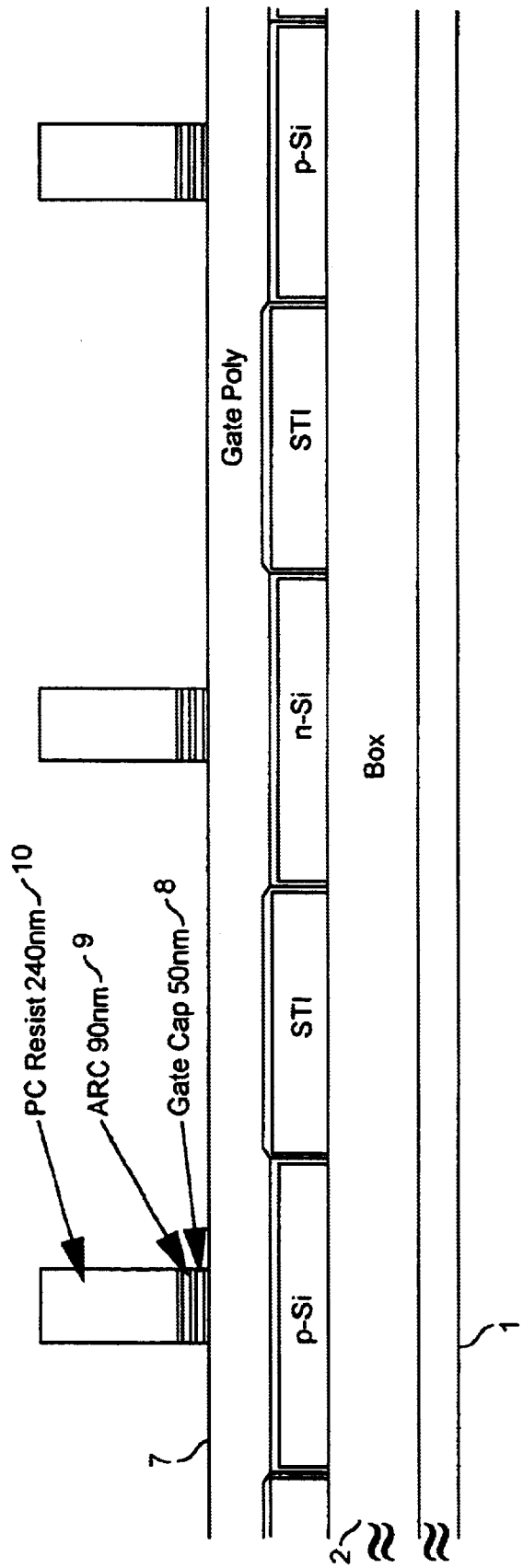
Figure 2C:
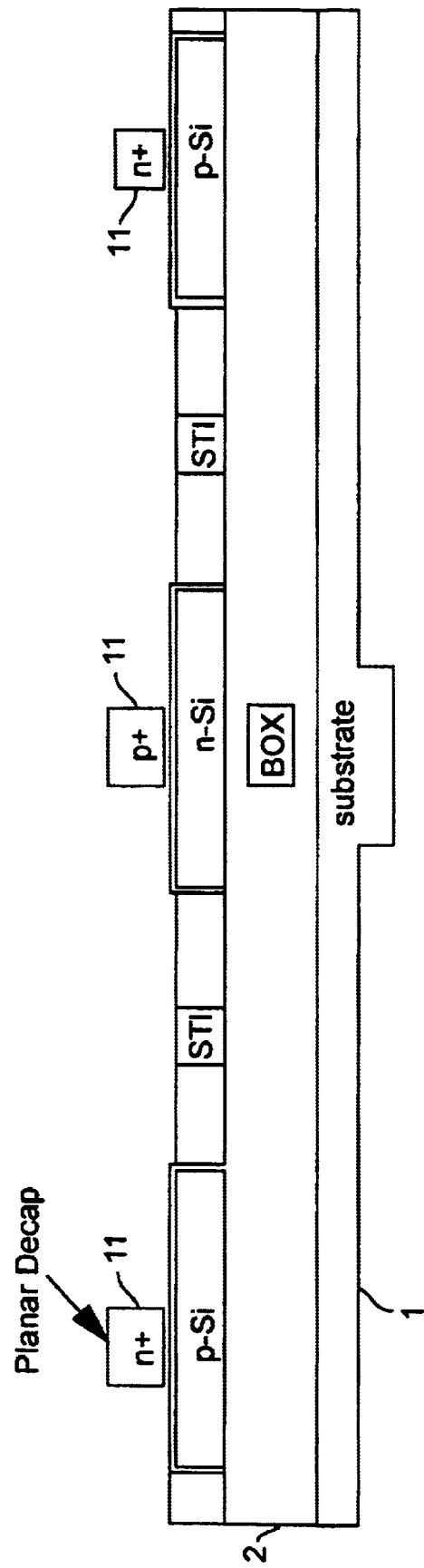

FIGS. 6A to 6H show the method for forming the DTC Decap capacitor according to the invention. As with the conventional planar Decap method shown in FIGS. 2A to 2C, the process begins with a silicon substrate 21 in which the buried oxide (BOX) layer 22 is formed, leaving a thin silicon layer 23, forming the silicon-on-insulator (SOI) device.

Figure 6A:
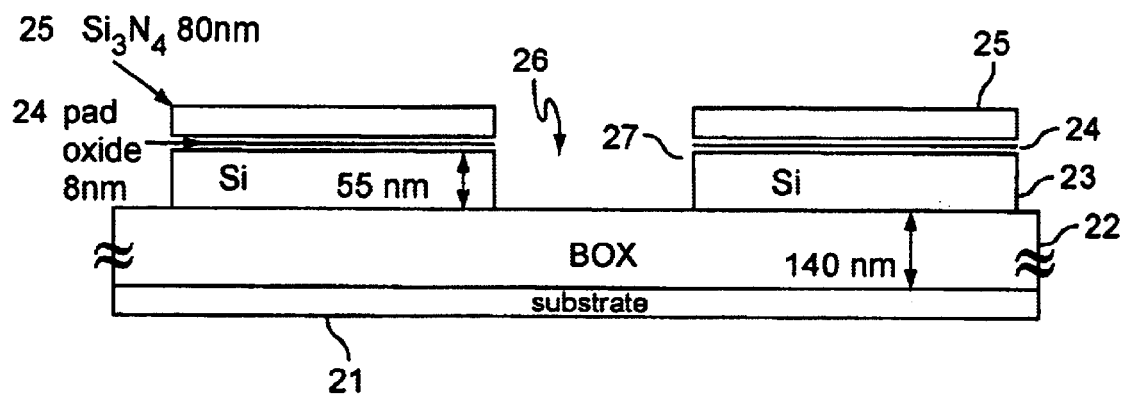
FIGS. 6A to 6H show the method of forming the STC according to the invention.

FIG. 6A shows the shallow trench insulation (STI) formation. First, a HOT pad oxide 24 is formed at 900° C. to a thickness of 8 nm over the silicon layer 23. Using low pressure chemical vapor deposition (LPCVD) at 785° C., a silicon nitride ($Si_3N_4$) layer 25 is next formed to a thickness of 80 nm. The entire structure is then coated with a photoresist and lithographically patterned. The photoresist is then developed to form a mask. Using reactive ion etching (RIE), the open areas of the mask are etched down to the buried oxide layer 22 to form a trench 26. The photoresist is stripped and an oxide liner 27 is formed within the trench 26 to a thickness of 10 nm.

Figure 6B:
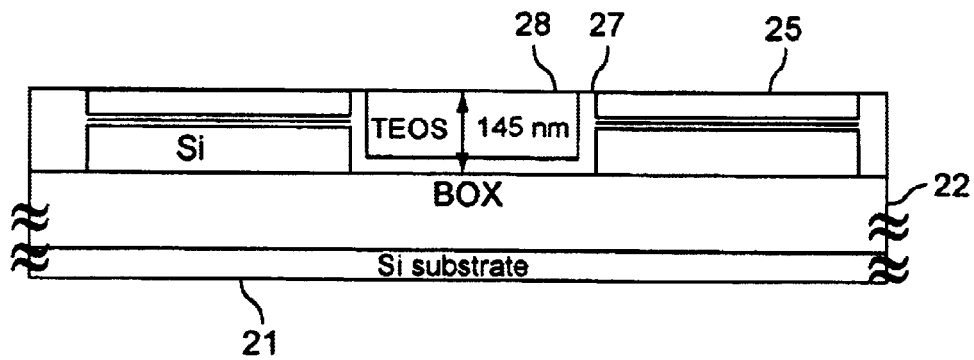

FIG. 6B shows the process of filling the the shallow trench. Using high density plasma chemical vapor deposition (HCPCVD) of tetraethoxysilane ($Si(OC_{25})$, abbreviated TEOS, the trench 26 is filled with $SiO_2$ which extends to a total thickness of 180 nm above the buried oxide layer 22. The shallow trench oxide 28 is annealed at 900° C. in a nitrogen atmosphere. The structure is subjected to a chemical/mechanical polish (CMP) to remove excess oxide down to the level of the silicon nitride layer 25.

Figure 6C:
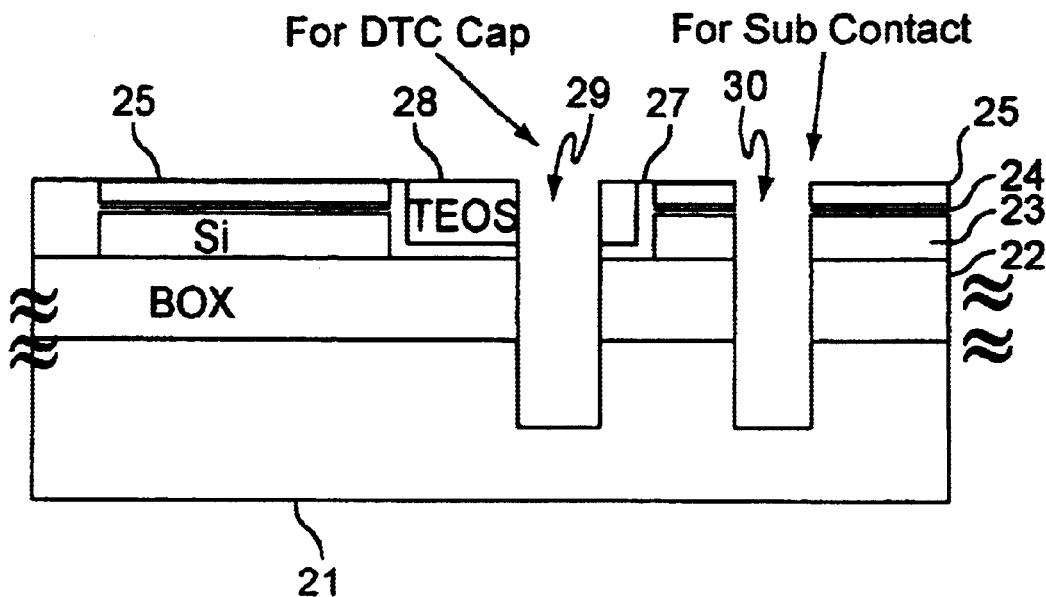

FIG. 6C shows forming the Decap capacitor and substrate contact formation. The structure is coated with a photoresist, lithographically patterned, and developed to form a mask. Using reactive ion etching (RIE), the exposed areas are etched to form two trenches or holes 29 and 30. The hole 29 extends through the oxide 28, the oxide liner 27, the buried oxide layer 22, and into the substrate 21. This hole will be used to form the Decap capacitor. The second hole 30 extends through the silicon nitride layer 25, the pad oxide 24, the silicon layer 23, the buried oxide layer 22, and into the substrate 21. This hole will be used to form the substrate contact. After etching, the photoresist mask is stripped. The size and depths of these holes 29 and 30 will depend on the desired capacitance for the Decap capacitor. See FIGS. 3 and 4.

Figure 6D:
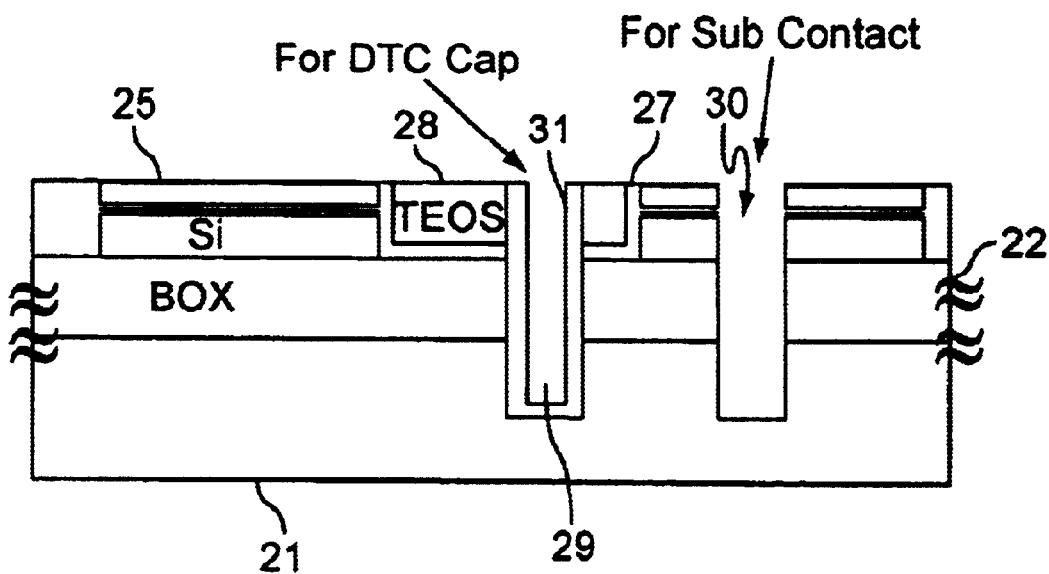

FIG. 6D shows the Decap capacitor gate oxide 31 formation. This oxide layer serves as the dielectric of the Decap capacitor. After formation of the oxide layer 31, the thickness of the layer is measured. A mask is formed with photoresist which is lithographically patterned and developed to expose only the hole 30. The structure is dipped in hydrofluoric acid to clean and etch the oxide in the substrate contact region in hole 30.

Figure 6E:
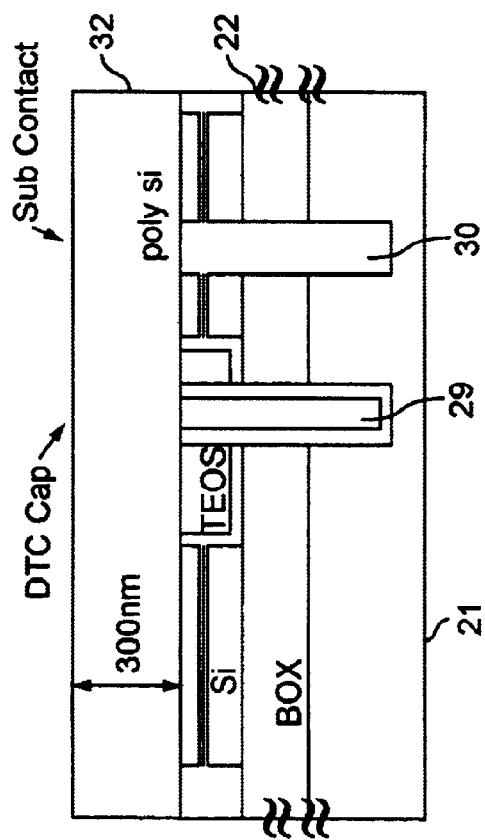

FIG. 6E shows the polysilicon fill 32 of the holes 29 and 30. This is performed using low pressure chemical vapor deposition (LPCVD) at 620° C. to a thickness of 300 nm above the surface of the structure.

Figure 6F:
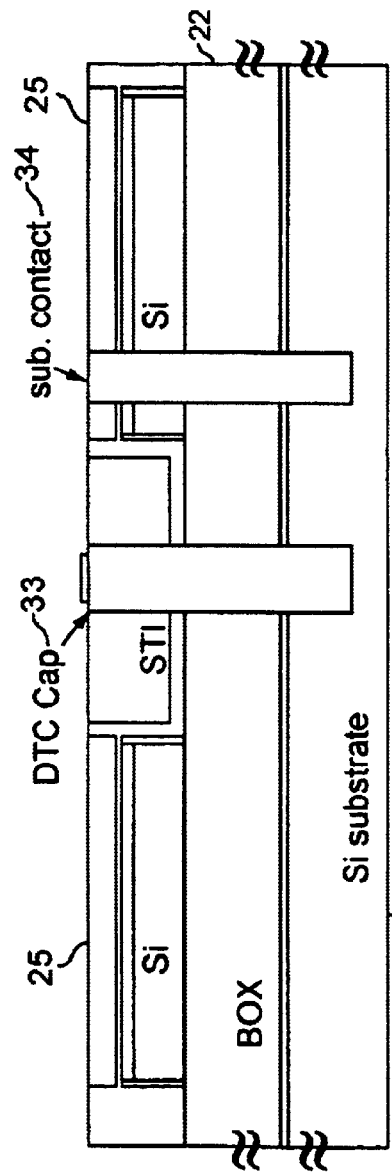

FIG. 6F shows the structure after the structure has been subjected to chemical/mechanical polishing (CMP) to remove the polysilicon to the pad silicon nitride 25. This is followed by a reactive ion etch (RIE) and an oxide wet etch in dilute hydrofluoric acid for 540 seconds.

Figure 6G:
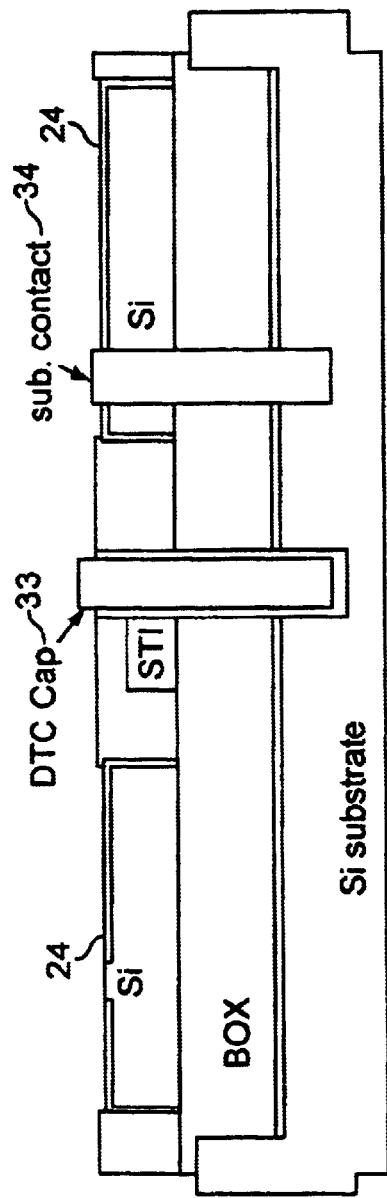

FIG. 6G shows the stripping of the silicon nitride pads. This is accomplished using hot phosphoric acid for 120 seconds. After the silicon nitride is stripped, the pad oxide 24 is measured. At this point in the process, the Decap trench capacitor polysilicon contact 33 and the substrate polysilicon contact 34 stand proud of the top surface of the structure.

It will be understood by those skilled in the art that at this point in the process, the standard CMOS processes used to form N-channel and P-channel devices with thin gate oxide and polysilicon interconnect can be performed. But as these processes form no part of the subject invention, they are not described here.

Figure 6H:
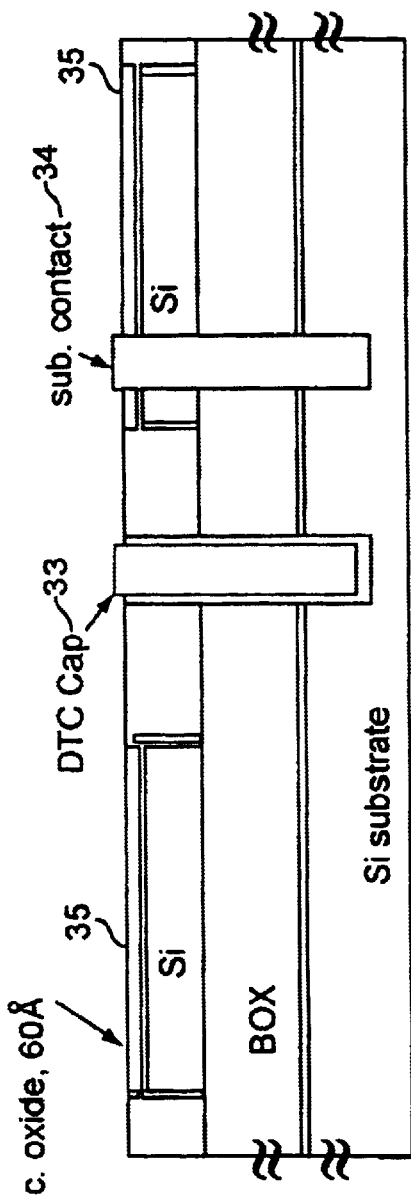

FIG. 6H shows the gate sacrificial oxide formation. First, the pad oxide 24 is stripped and the structure cleaned. Then, the sacrificial oxide 35 is formed. The sacrificial oxide is the process for the standard device build and, while it has nothing to do with the present invention, it is used for continuity. It has been implemented in the preferred embodiment of the invention for defect improvement to clean the silicon surface by oxidizing and wet etching the surface.

While the invention has been described in terms of a single preferred embodiment, those skilled in the art will recognize that the invention can be practiced with modification within the spirit and scope of the appended claims.

What is claimed is:

1. An on-chip decoupling trench capacitor for silicon-on-insulator devices comprising:
   a buried oxide layer on a silicon substrate;
   a silicon layer over the buried oxide layer, said silicon layer having formed therein shallow trench insulation extending to the buried oxide layer;
   a first trench formed in the shallow trench insulation and extending through the buried oxide layer into the silicon substrate, the first trench having formed on the walls thereof an oxide insulating layer and then filled with polysilicon to form the decoupling capacitor; and
   a second trench formed in the silicon layer adjacent to the first trench and extending through the buried oxide layer into the silicon substrate, the second trench being filled with polysilicon and forming the substrate contact for the decoupling capacitor.

2. An on-chip decoupling trench capacitor structure comprising:
   a silicon substrate;
   a buried oxide layer on the silicon substrate;
   a silicon layer over the buried oxide layer having shallow trench insulation extending to the buried oxide layer;
   a decoupling capacitor located in a trench formed in and extending through the shallow trench insulation and the buried oxide layer into the silicon substrate, said decoupling capacitor including a dielectric liner covering an interior of said trench; and
   a substrate contact trench for the decoupling capacitor formed in the silicon layer adjacent to the decoupling capacitor trench and extending through the buried oxide layer into the silicon substrate.

3. The on-chip decoupling trench capacitor structure as recited in claim 2, wherein said decoupling capacitor trench and the substrate contact for the decoupling capacitor trench are filled with polysilicon.

4. The on-chip decoupling trench capacitor structure as recited in claim 2, wherein the width and depth of said decoupling capacitor trench is chosen to provide a predetermined capacitance.

5. An on-chip decoupling trench capacitor comprising:
   a silicon layer having formed therein shallow trench insulation;
   a first trench formed in the shallow trench insulation and having formed on the walls thereof an oxide insulation layer and then filled with polysilicon to form the decoupling trench capacitor; and
   a second trench formed in the silicon layer adjacent to the first trench and filled with polysilicon to form a substrate contact for the decoupling trench capacitor.

6. The on-chip decoupling trench capacitor recited in claim 5, wherein the width and depth of the first trench is chosen to provide a predetermined capacitance.

7. The on-chip decoupling trench capacitor recited in claim 5, wherein the decoupling trench capacitor is for silicon-on-insulator devices further comprising:
   a buried oxide layer on a silicon substrate, said silicon layer being formed over the buried oxide layer, said shallow trench insulation extending to the buried oxide layer, the first trench extending through the buried oxide layer into the silicon substrate and the second trench extending through the buried oxide layer into the silicon substrate.

8. The on-chip decoupling trench capacitor recited in claim 7, wherein the width and depth of the first trench is chosen to provide a predetermined capacitance.

* * * * *